United States Patent
Loomis et al.

(10) Patent No.: US 7,302,761 B2
(45) Date of Patent: Dec. 4, 2007

(54) AUTOMATIC TOOL TILTING APPARATUS FOR A SCRIBE TOOL

(75) Inventors: James W. Loomis, Sebastopol, CA (US); Richard Avidano, San Jose, CA (US)

(73) Assignee: Loomis Industries, Inc., Saint Helena, CA (US)

( * ) Notice: Subject to any disclaimer, the term of this patent is extended or adjusted under 35 U.S.C. 154(b) by 190 days.

(21) Appl. No.: 11/243,641

(22) Filed: Oct. 5, 2005

(65) Prior Publication Data

US 2007/0089304 A1    Apr. 26, 2007

(51) Int. Cl.
*B26D 3/08*   (2006.01)
*B43L 13/00*  (2006.01)

(52) U.S. Cl. ............................ 33/32.3; 33/18.1; 83/879

(58) Field of Classification Search .............. 33/18.1, 33/21.1, 21.2, 21.3, 32.1, 32.2, 32.3, 32.4, 33/32.5, 32.6, 45, 503, 549; 83/879, 880, 83/881, 882, 883; 438/460, 462
See application file for complete search history.

(56) References Cited

U.S. PATENT DOCUMENTS

| | | | | |
|---|---|---|---|---|
| 2,701,417 A | * | 2/1955 | Graham | 33/18.1 |
| 3,555,954 A | * | 1/1971 | Payne et al. | 83/699.51 |
| 3,680,213 A | * | 8/1972 | Reichert | 33/18.1 |
| 4,095,344 A | * | 6/1978 | Loomis | 33/18.1 |
| 4,220,066 A | * | 9/1980 | Hargreaves et al. | 83/886 |
| 5,458,269 A | * | 10/1995 | Loomis | 225/2 |
| 5,820,006 A | * | 10/1998 | Turner | 225/96 |
| 6,916,726 B2 | * | 7/2005 | Ohno et al. | 438/460 |
| 2004/0126995 A1 | * | 7/2004 | Ohno et al. | 438/460 |

* cited by examiner

*Primary Examiner*—R. Alexander Smith
(74) *Attorney, Agent, or Firm*—Craig M. Stainbrook; Stainbrook & Stainbrook, LLP

(57) ABSTRACT

An automatically programmable tilting mechanism for holding a scribe tool at varying angles using an aerostatic bearing. The air bearing secures the scribe tool about its longitudinal shank and generally allows for free axial movement while the tool holding structure prevents rotation of the scribe tool, thus providing extremely fine compliance and force application of the scribe tool point against the substrate. During a scribing process, the tilting mechanism regularly adjusts the angle of the scribe tool relative to the substrate so that a fresh cutting edge is always being employed in the scribing process.

18 Claims, 11 Drawing Sheets

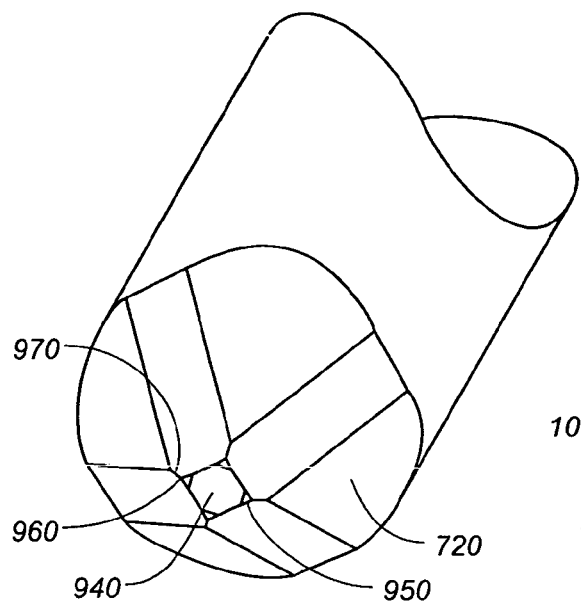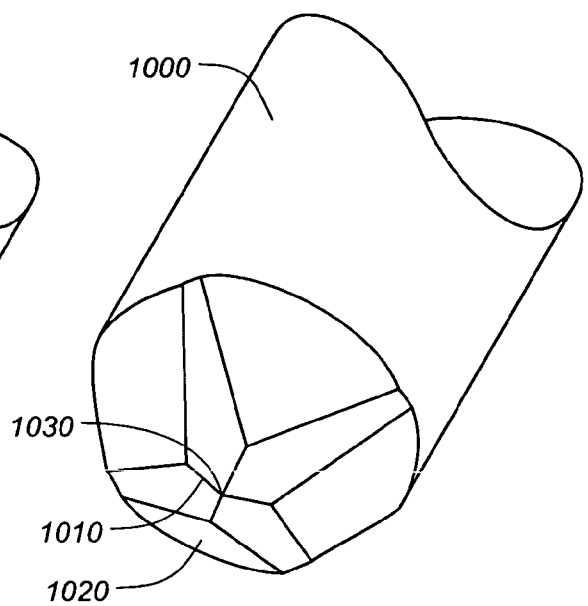
FIG. 8A
FIG. 8B
*(PRIOR ART)*
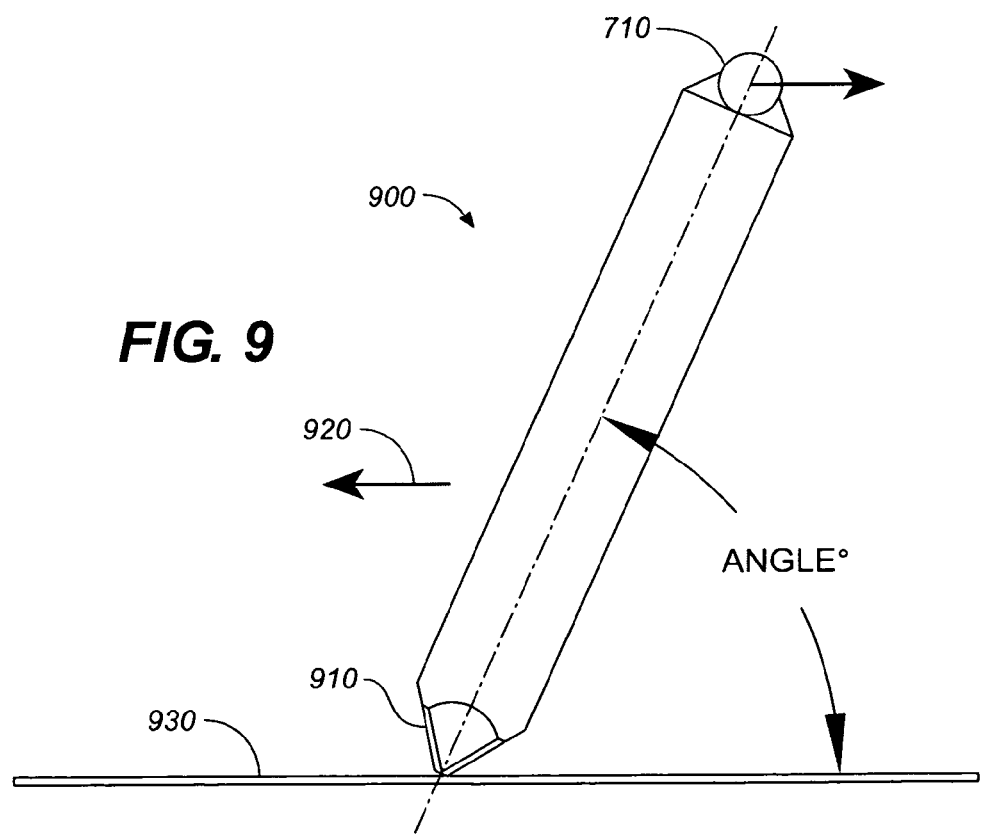
FIG. 9

AUTOMATIC TOOL TILTING APPARATUS FOR A SCRIBE TOOL

CROSS REFERENCE TO RELATED APPLICATIONS

Not applicable. The present application is an original regular national patent application.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention also relates to methods and apparatus for semiconductor wafer processing and more generally to an apparatus and method for scribing and breaking frangible materials such as semiconductor wafers. More particularly the invention relates to application of a scribe tool to the task of making a scribe line in frangible material to give a controlled break along that scribe line. The apparatus for applying the scribe tool is an automatically programmable tilting mechanism which holds the tool with an aerostatic bearing while tilting it regularly during a scribing operation. The aerostatic air bearing affords extraordinary compliance and force application of the scribe tool point against the surface being scribed. The frictionless compliance, precise force application and continuous angle adjustment combine to give improved scribing and much greater working life to the scribe tools points.

BACKGROUND INFORMATION AND DISCUSSION OF RELATED ART

Semiconductors are manufactured in an integral fashion on a wafer of semiconductor material. Such wafers are commonly, but not exclusively single crystals of silicon, gallium arsenide, indium phosphide, gallium nitride, germanium etc. The economy of manufacture is created by producing hundreds or thousands of the same semiconductor device or circuit, in mass, on a single wafer at one time. The devices are organized on the wafer in rows and columns.

After the semiconductors are manufactured on the wafer, the devices must be separated from each other (singulated) so they can be used individually. This processing is called wafer dicing. Wafer dicing is performed by cutting or scribing and breaking along the separation areas (streets) between the rows and columns. Some of the apparatus for cutting are rotary saws and laser burning. Some of the apparatus for scribing and breaking are sharp tool and laser scribing.

Sharp tool scribing is the oldest technique and been practiced since the Semiconductor Industry began in the 1960s before that when glass was invented. A scribing method is described in U.S. Pat. No. 4,095,344, dated Jun. 29, 1978, and entitled "Scribe Tool and Mount Therefore", to James W. Loomis, one of the present inventors. An improved method of dicing scribed wafers was shown in U.S. Pat. No. 5,458,269, to James W. Loomis, dated Oct. 17, 1995. Each of the forgoing patents is incorporated in its entirety herein by reference.

There have been many promising innovations in semiconductor separation methods since the Loomis '344 patent was issued, and even since the '269 patent was issued, particularly in the area of laser cutting technology. However, the scribing and breaking method of wafer singulation continues to have several advantages over the sawing and cutting methods. In particular, the scribing and breaking of wafers does not create appreciable particle and dust contamination. Thin semiconductor wafers are exquisitely sensitive to contamination by small charged particles, and both abrasive sawing and laser cutting techniques generate a considerable volume of particles and dust that tend to redeposit on the wafer surface. Cleaning of such particles is challenging because the particles adhere to the wafer surface with remarkable tenacity through the van der Waals force, electrostatic forces, and capillary action. The mechanical forces required to overcome the attaching forces and to remove the contaminant particles are often more than sufficient to damage the devices by compromising wire bonds or generating short circuits.

Accordingly, methods were devised to protect the wafer from dust and particle contamination. One method employs a thin protective layer of photo resist, which is peeled from the wafer after singulation through an etching process. Another employs rinsing the wafer as it is sawn in a wet sawing process. Yet another entails covering the wafer with a thin sheet of DI water during sawing. All are expensive and time consuming and the latter two produce a slurry which itself may contaminate the wafer, thus producing a poor product yield.

Sharp point scribing and breaking of thin semiconductor wafers does not generate appreciable contaminant dust and small particles. It is relatively fast and inexpensive, and it reduces the method steps employed in the fabrication processes. As an older and well-established method, it has also reached a stage of considerable refinement. Thus, the method is still preferred by many manufacturers.

However mature it may be in relation to other singulation methods, sharp point scribing has not transcended the need for improvement. One feature of the scribe and break method that limits its efficiency is that the cutting edge of diamond tipped scribes quickly dull through use. After even a single pass over the surface of a wafer, the cutting edge begins to dull and degrade and its ability to scribe the surface sufficiently for damage-free breaking diminishes. In the case of diamond tipped scribe tools, it is a common practice to routinely change the angle of the tool manually after a predetermined number of passes depending on the nature of the substrate, the depth of the scribing, and the quality of the cutting edge. The durability under any set of circumstances can now be fairly accurately predicted from numerous prior microscopic observations of scribe points in use.

Because diamond tips have multiple scribe edges formed in the lapping and polishing process, changing the angle very slightly can bring a new portion of a cutting edge or an altogether new edge into engagement with the wafer, thereby ensuring optimum cutting efficiency. Thus, there has arisen a need to automatically move and control cutting edge engagement with wafer surface during the singulation process.

Scribing and breaking is a phenomenon not well understood. A proper scribe line is a ductile deformation created in the scribed surface. A ductile formed scribe will break without creating dust and cracking. Brittle materials will behave in a ductile fashion when scribed with a microscopically sharp point. The ductile deformation freezes immediately as the deforming point passes a spot x/t. Upon freezing very high stress is created lateral to the scribe line. If the point is sharp and is replicated in the frozen deformation a vertical crack will form under the scribe line. This crack, under the frozen deformation, is a controlled fracture. Applying tensile strain to the crack causes the crack to grow through the wafer.

Creating this deformation and the resulting scribe line causes very high wear on the sharp point. Because of this high wear, the material of choice for sharp points is diamond. Diamond is the hardest material in nature, has a low coefficient of friction and has a thermal conductivity greater than copper. If the scribe point is formed in the proper crystalline structure of the diamond, the point will have optimum wear. Loomis Industries has developed manufacturing techniques that provide scribe tools that are durable and consistent. This consistency in manufacture gives consistency in scribing and consistency in wear life. Consistency is the essence of all manufacturing; it is extremely important for scribe dicing. Scribing must be 100% consistent if break yield is to be high. Knowing how long a point will last is critical so the point can be removed/changed before end of life. If the longevity of a point is ninety meters, the point must be replaced before that. When should a point be replaced? Usually replacement is at the completion of a wafer. A wafer that is 150 mm diameter with dice that are 1×1 mm requires 34 meters of scribing. If point replacement is effected prior to 90 meters and the point is changed after wafer completion, then the point must be replaced at 68 meters (only having produced two wafers). However, if the scribe point lasts 350 meters, then ten wafers can be scribed.

Increased point life creates the following advantages: (1) reduced tool cost (perhaps as little as one fifth the costs for conventional scribing methods; (2) greater than 99 percent yield; (3) greater machine productivity; and (4) improved product quality.

BRIEF SUMMARY OF THE INVENTION

The present invention solves the foregoing problem by providing a new and improved scribe tool holder having an automatic, motorized tool tilting apparatus, and also having an air bearing supporting the scribe tool stylus (shank) and controlling the pressure placed on the wafer surface by the scribe tool tip. Additionally, the present invention provides an improved diamond scribe tool stylus especially adapted for use with the motorized tilting apparatus.

It is therefore an object of the present invention to provide a new and improved method and apparatus for scribing semiconductor wafers.

It is another object of the present invention to provide a new and improved method and apparatus for automatically controlling the angle of a scribe tool stylus.

A further object or feature of the present invention is a new and improved method and apparatus for automatically and, selectively, continually changing angle of the scribe tool tip so that undulled cutting edges can come into use for scribing a semiconductor wafer during fabrication.

An even further object of the present invention is to provide a novel air bearing system for supporting a scribe tool stylus such that the stylus can respond with generally axial movement as the stylus tip passes over minute irregularities on the wafer surface.

A still further object is to provide an improved scribe tool having a diamond tip with a truncated tip and a cutting edge configuration that allows for heel scribing.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty that characterize the invention are pointed out with particularity in the claims annexed to and forming part of this disclosure. The invention does not reside in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein:

FIG. 2 is an upper right front perspective view thereof, while

FIG. 8A is a perspective view showing the improved scribe tool stylus tip of the present invention;

FIG. 8B is a perspective view showing a conventional scribe tool stylus tip; and FIG. 9 shows the heel scribing made possible by the inventive tip and the tool tilting apparatus of the present invention.

DETAILED DESCRIPTION OF THE INVENTION

Figure 1:
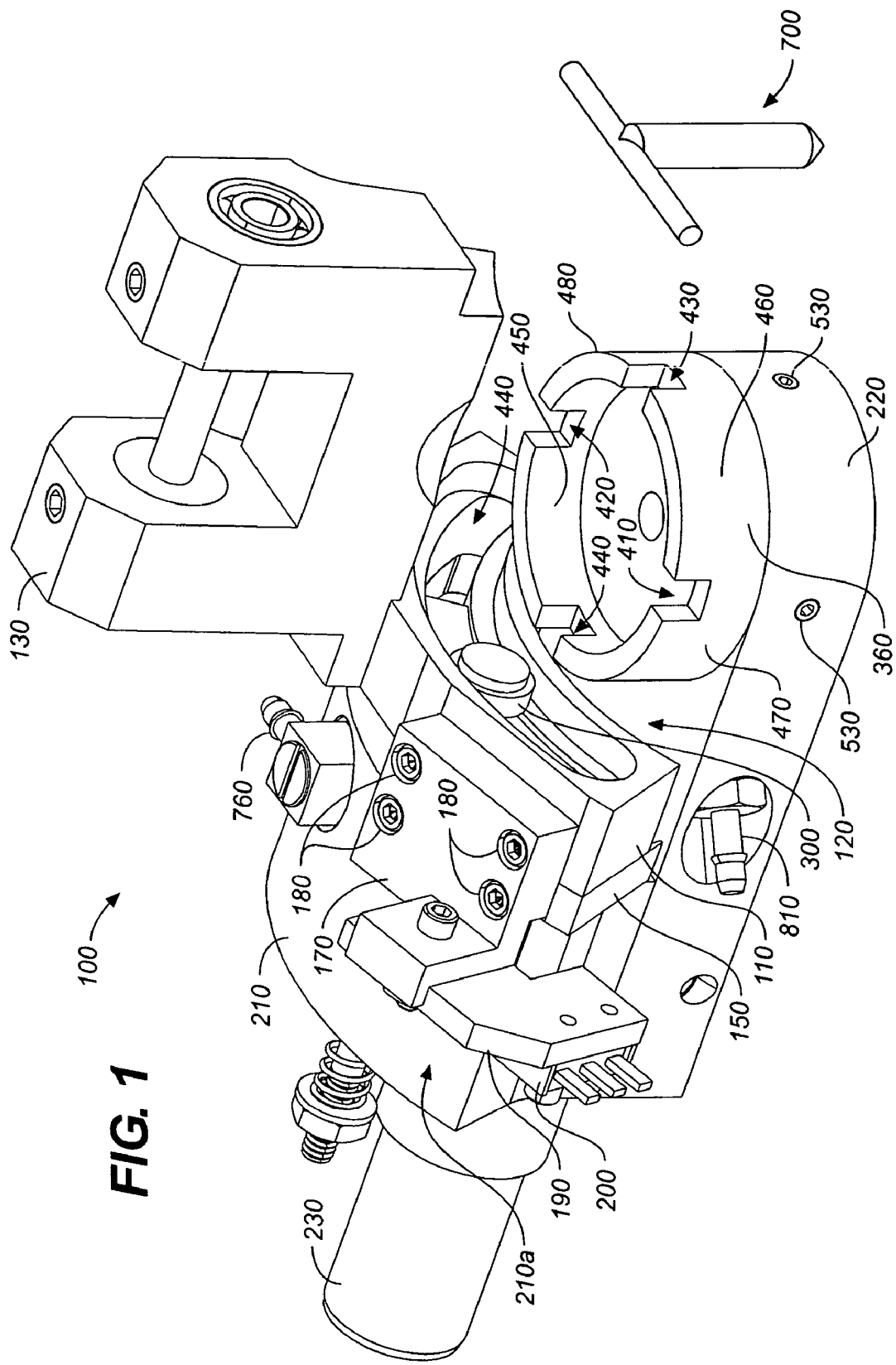
FIG. 1 is an upper left front perspective view of the automatic tool tilting protractor for a scribe tool of the present invention.
Figure 2:
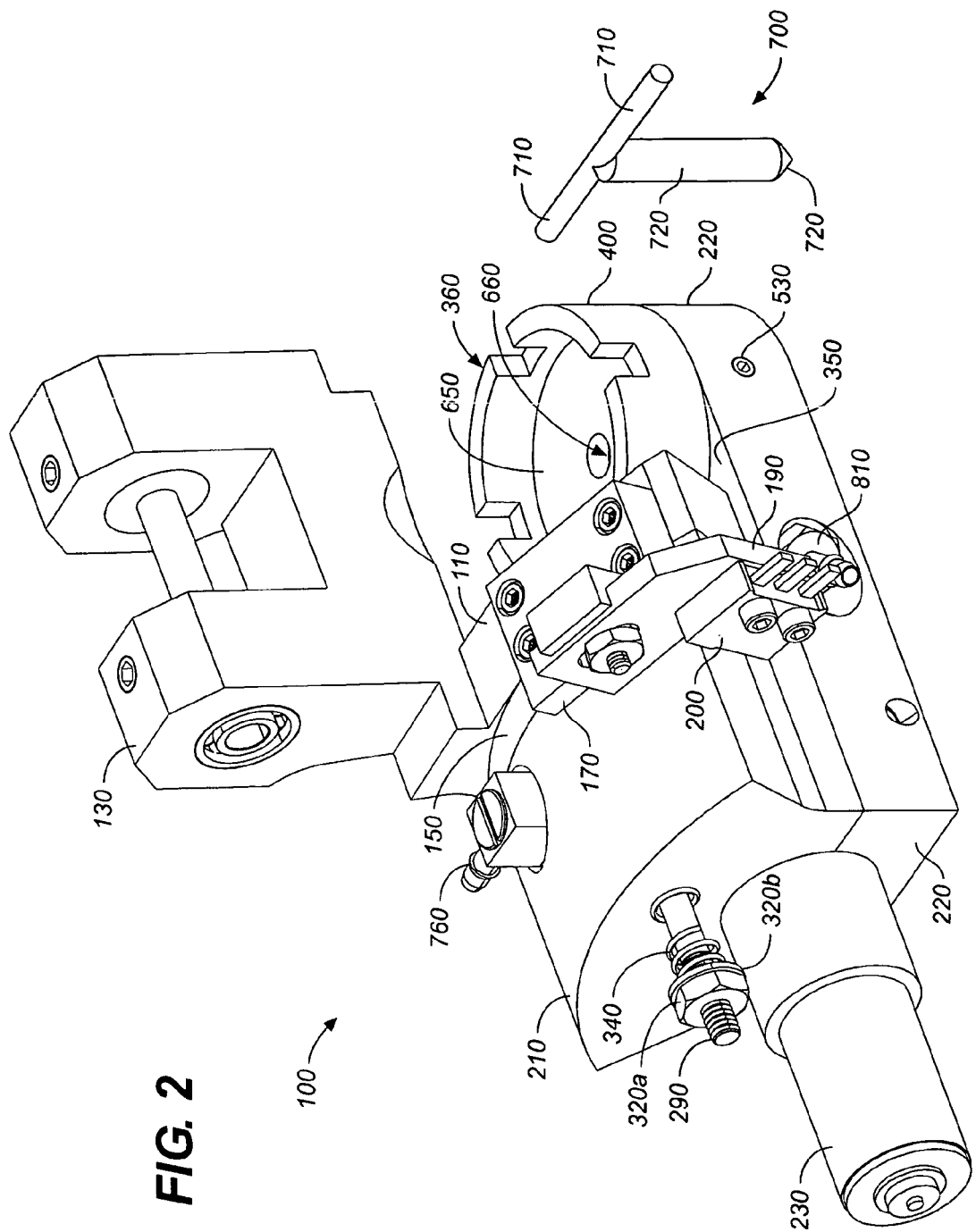
Figure 2A:
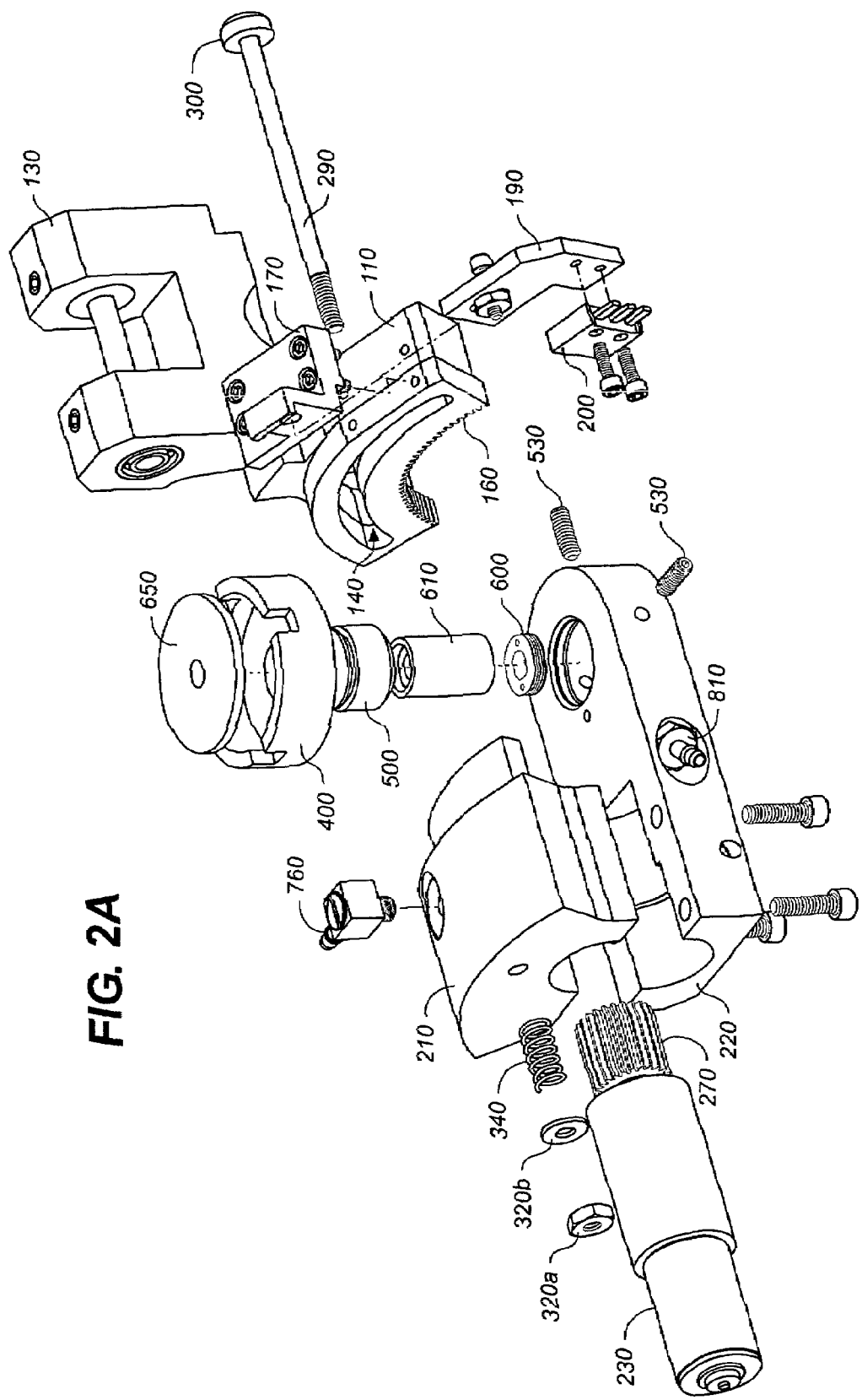
FIG. 2A is an exploded view thereof.
Figure 3:
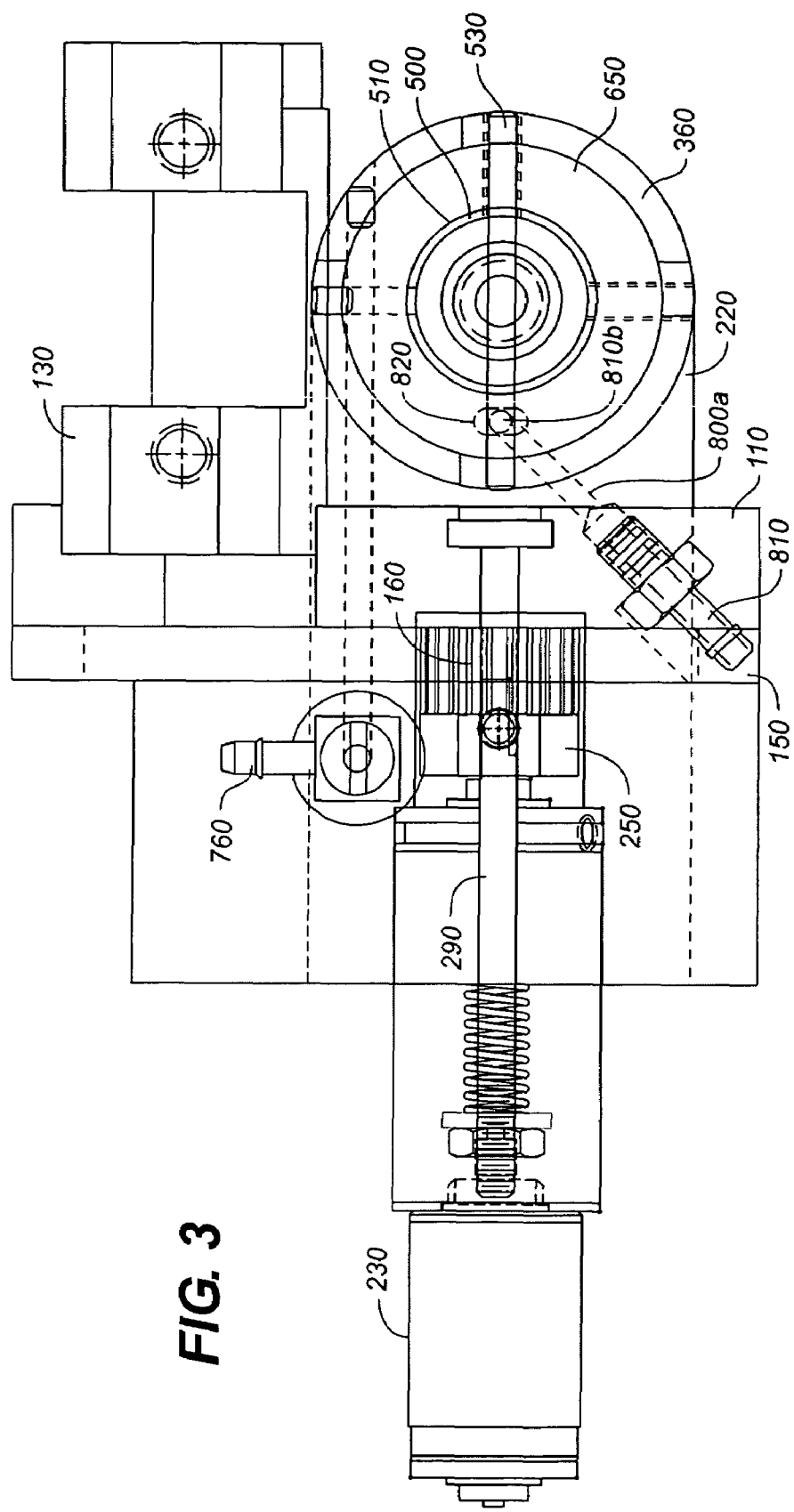
FIG. 3 is a cross-sectional top plan view thereof.
Figure 4A:
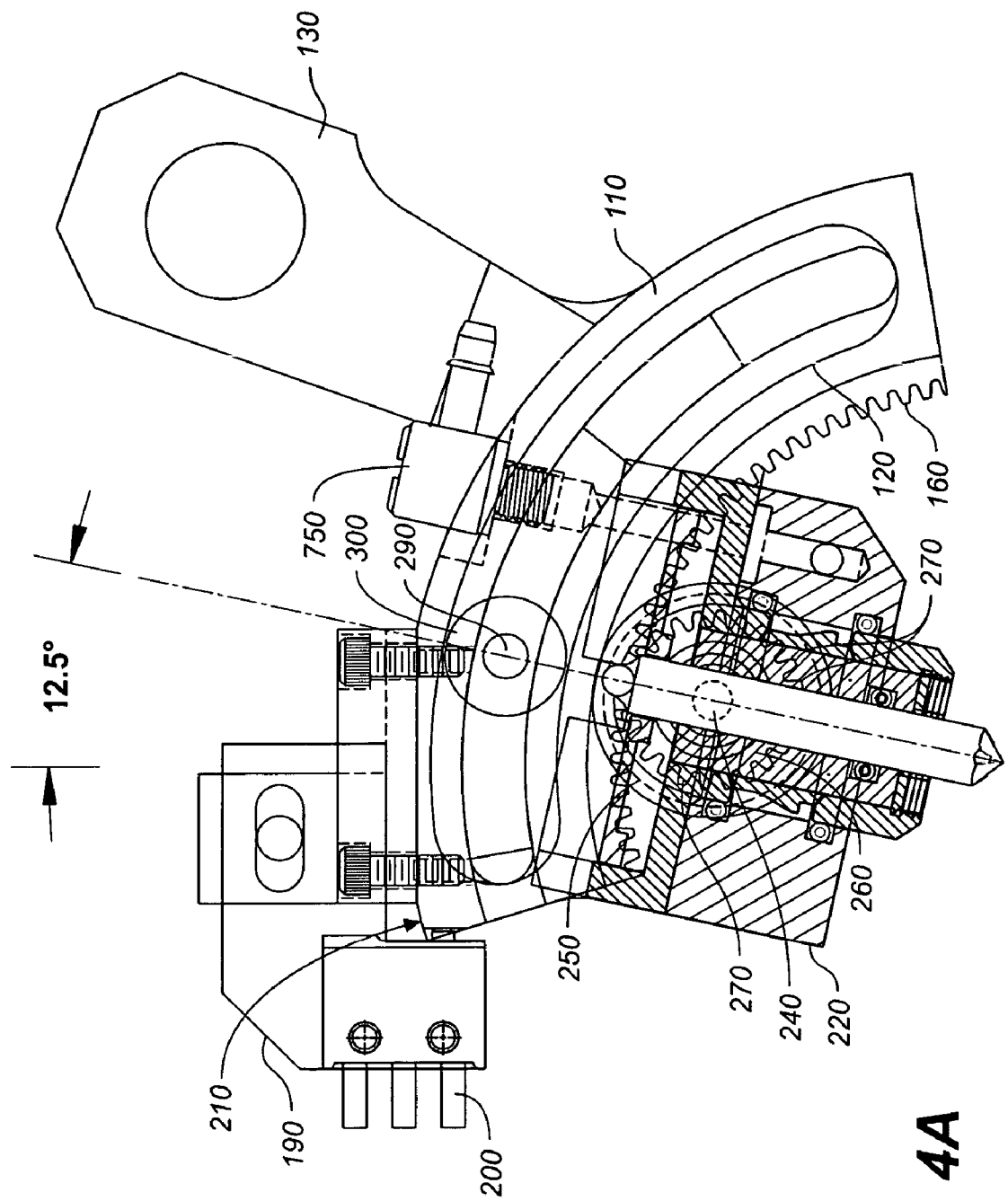
FIG. 4A is a cross-sectional right side view in elevation, showing the tool holder mount tilted at a first angle.
Figure 4B:
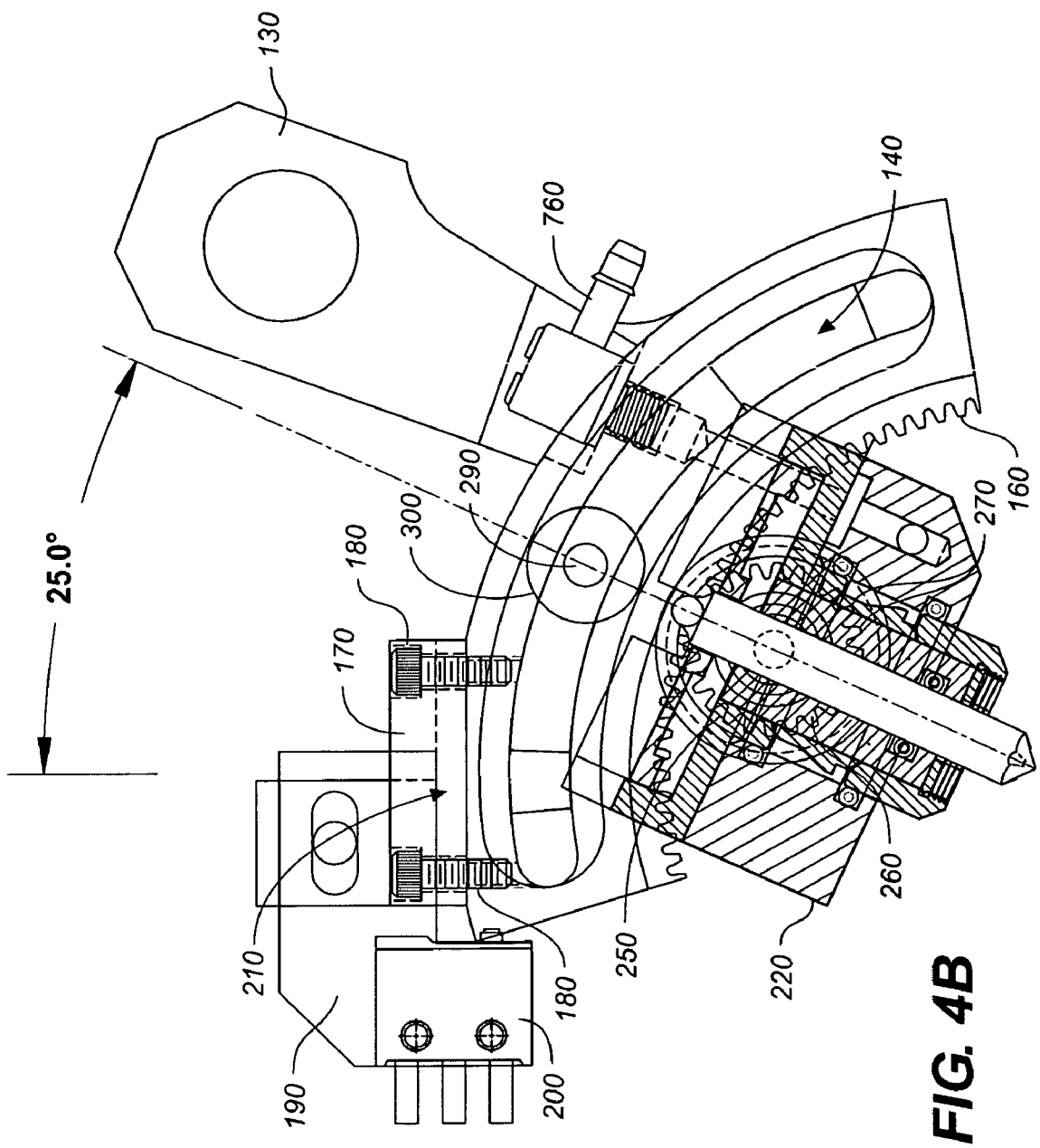
FIG. 4B is a cross-sectional side view in elevation showing the tool holder mount tilted at a second angle.
Figure 5:
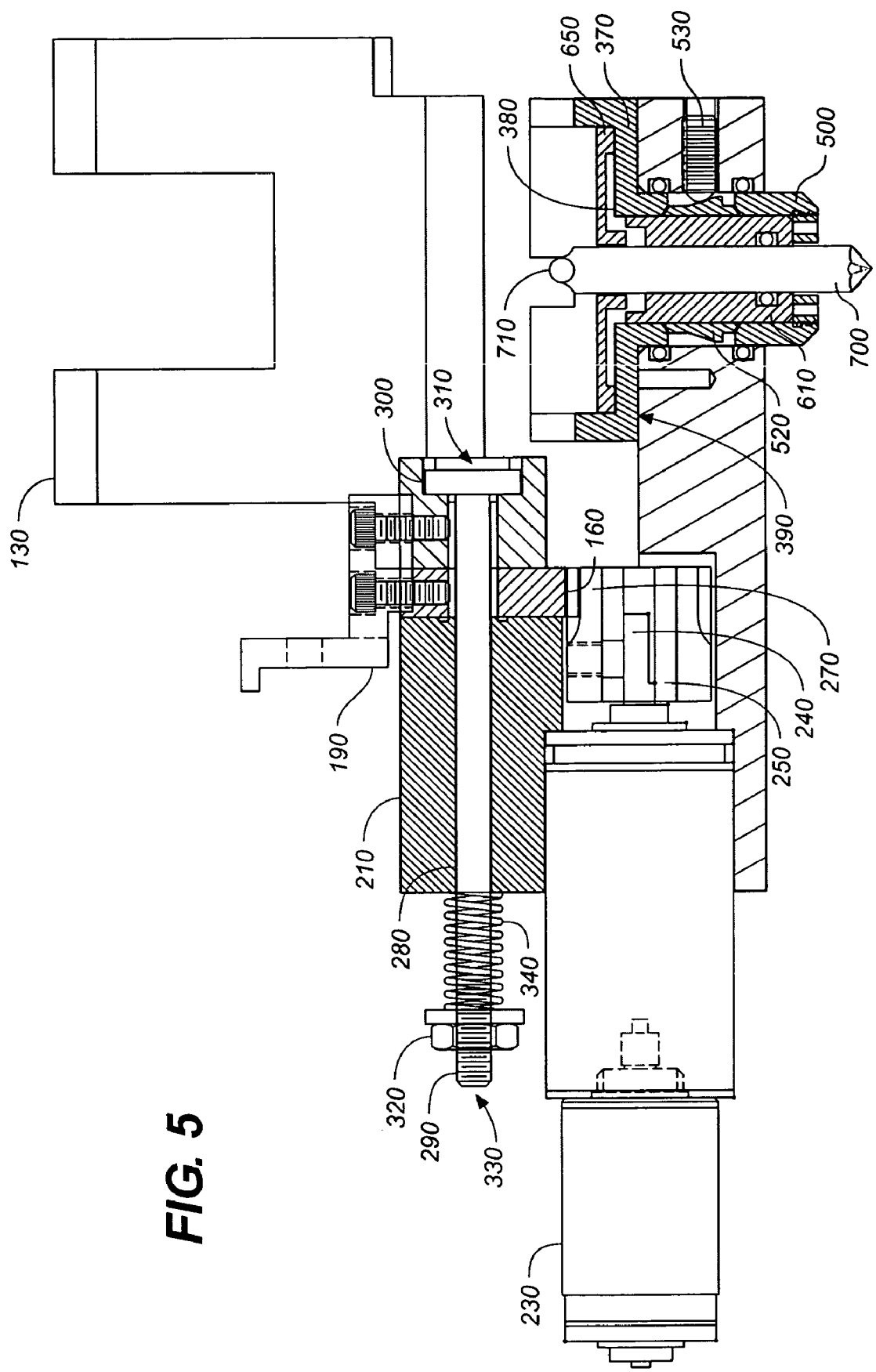
FIG. 5 is a cross-sectional front view in elevation of the inventive apparatus.
Figure 6A:
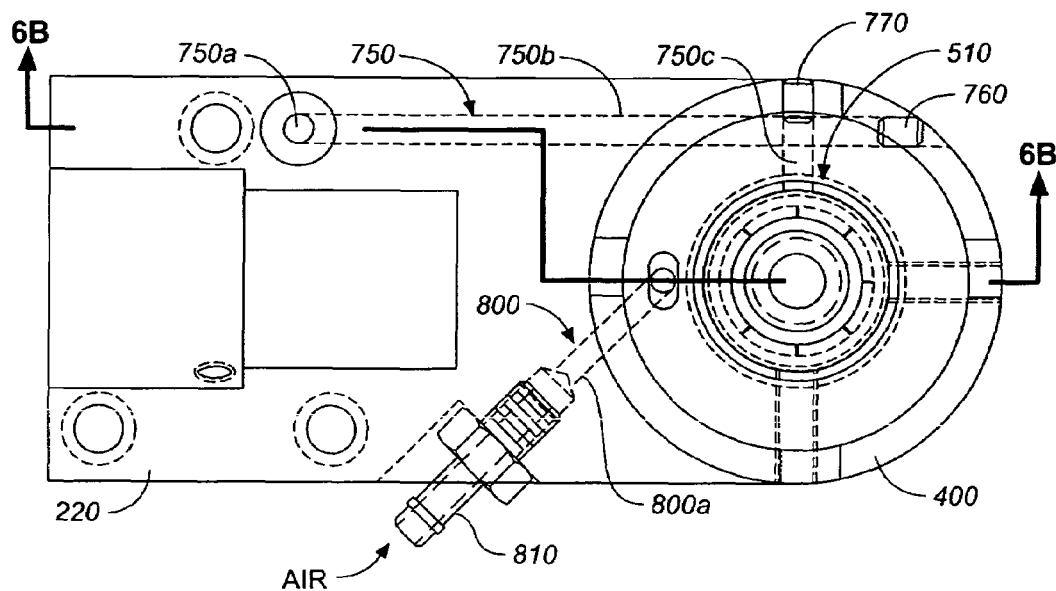
FIG. 6A is a schematic partial top plan view showing details of the air supply for the air bearing system of the present invention.
Figure 6B:
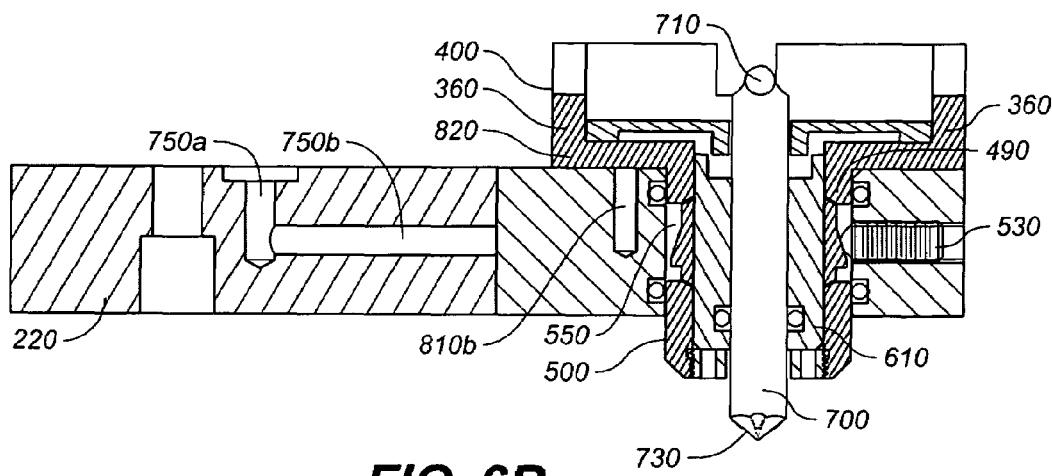
FIG. 6B is a schematic partial cross-sectional side view in elevation taken along line 6B-6B of FIG. 6A.
Figure 7A:
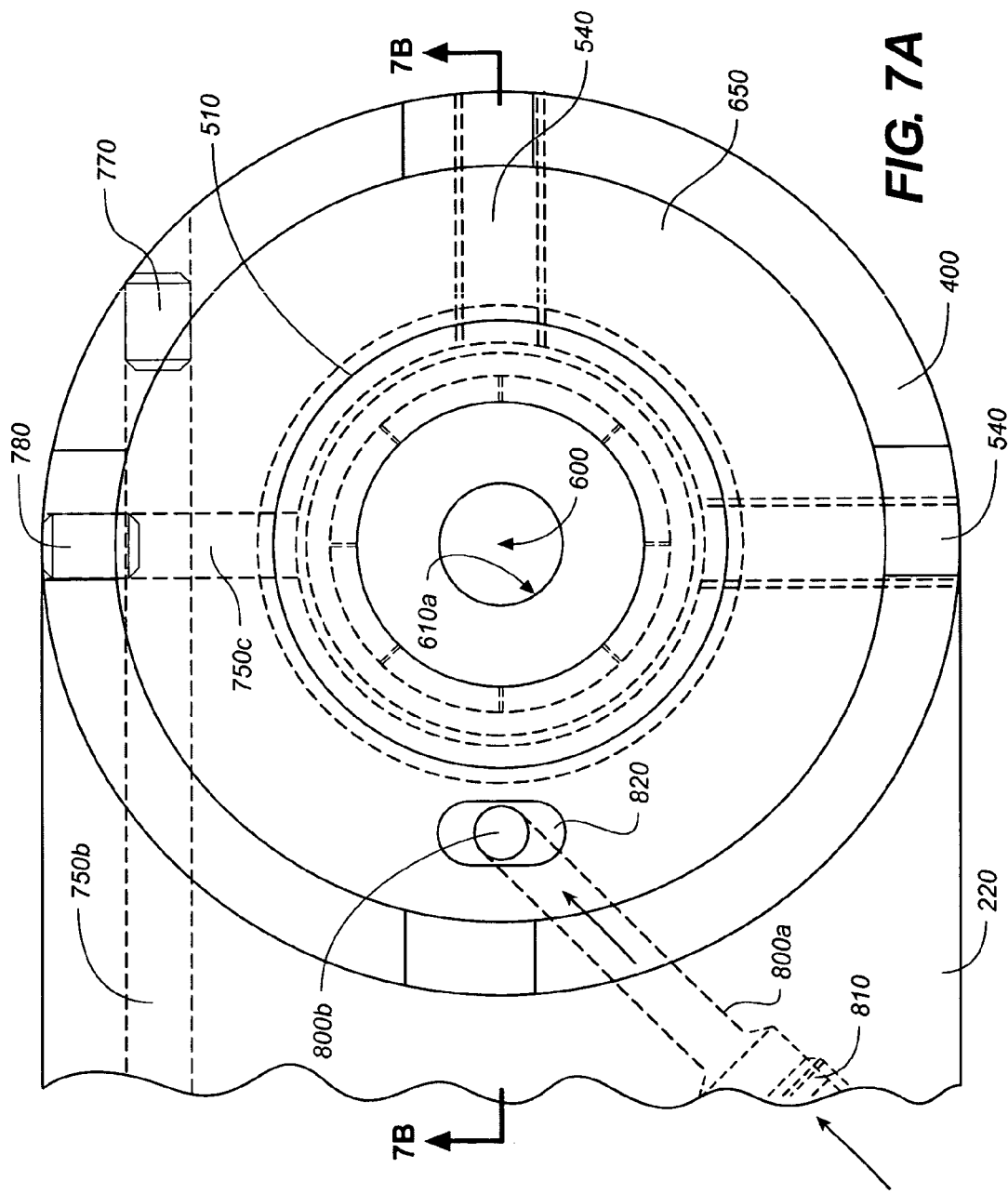
FIG. 7A is a schematic top plan view showing further details of the air supply for the inventive air bearing system.
Figure 7B:
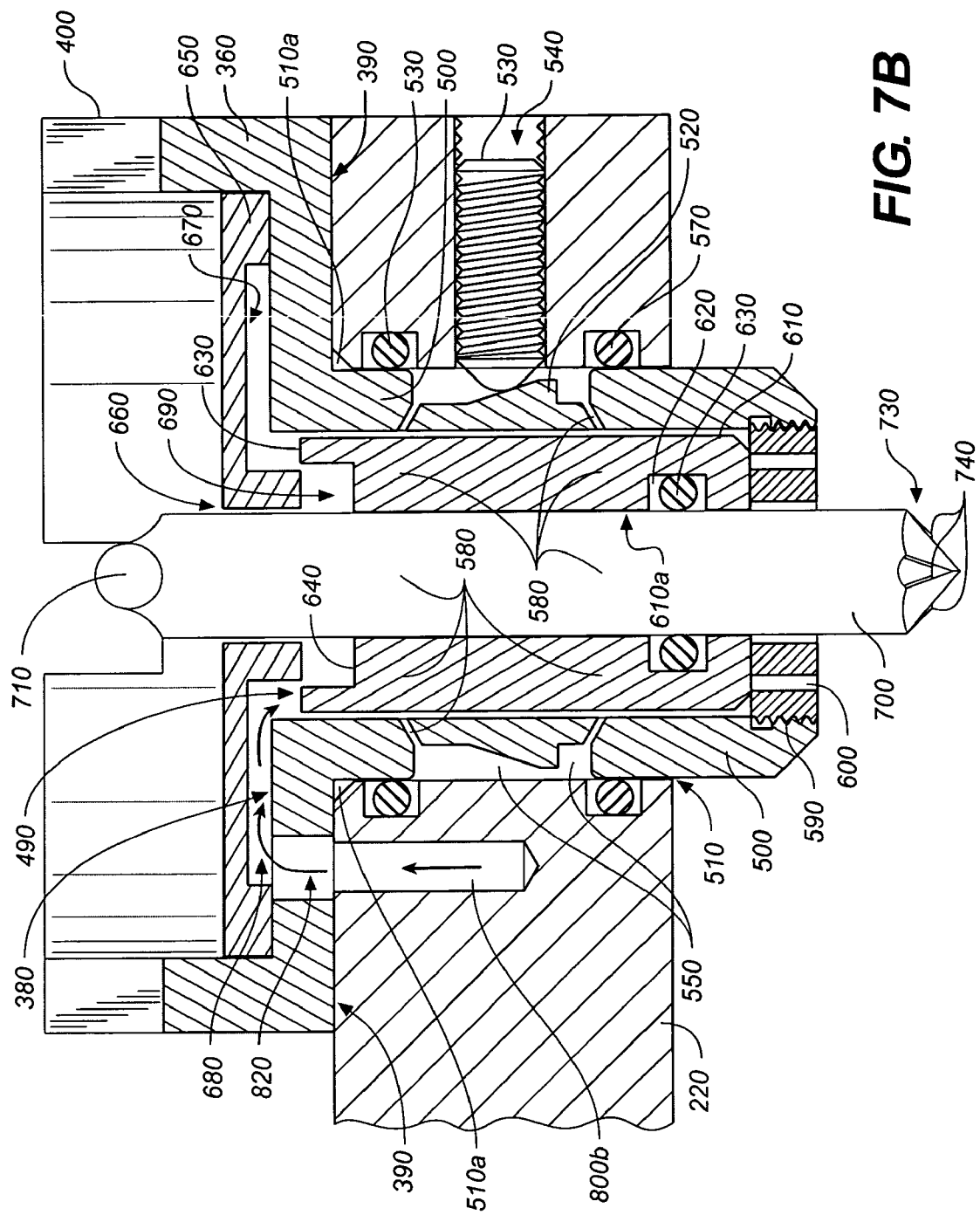
FIG. 7B is a detailed schematic cross-sectional front view of the air bearing system for supporting the scribe tool stylus.

Referring to FIGS. 1 through 9, wherein like reference numerals refer to like components in the various views, there is illustrated therein a new and improved automatic tool tilting protractor for a scribe tool, generally denominated 100 herein.

The figures collectively illustrate a first preferred embodiment of the inventive apparatus and show that it comprises a protractor 110 describing an interior arc and having an exterior side 120 to which a mounting bracket 130 is integrally affixed. The mounting bracket is for secure and rigid attachment to a linear translation system for semiconductor wafer scribing, as is shown in U.S. Pat. No. 5,458,269, incorporated in its entirety herein by reference. The protractor includes an elongate arcuate hole 140.

Immediately adjacent protractor 110 is an internal ring gear 150 having gear teeth 160. The protractor and internal ring gear are coupled with a switch block plate 170 which spans the width of both and is screwed into each with hex socket head screws 180. A switch block nut plate 190 is demountably and adjustably attached to the switch block plate 170 and a miniature snap action limit switch 200 is then coupled to the switch block nut plate.

An angle adjustment sector 210 forms an upper frame member for the apparatus, while a tool holder mount 220 forms a base or lower frame member for the apparatus. The angle adjustment sector 210 has a substantially planar lower surface 210a while the tool holder mount has a substantially planar platform 350, and the two portions are mated at the respective planar surfaces. The upper and lower frame portions are drilled or formed such that when the portions are joined, a cylindrical hole is provided to accommodate a substantially cylindrical electrical stepper motor 230 having a stepper motor shaft 240 which is journalled at its proximal end by a stepper motor shaft bushing 250. A pinion gear 260 is disposed on the stepper motor shaft and has gear teeth 270 in intermeshing relationship to the gear teeth of internal ring gear 160. The motor is supplied with power from a power source (not shown) electrically connected to the contacts of the snap action switch.

Angle adjustment sector 210 is provided with a cylindrical through hole such that a shaft 290 may be inserted therethrough. The shaft includes a slightly resilient wheel 300 (preferably nylon or rubber) rotatably mounted on its proximal end 310 and a nut and washer 320a/320b combination at a threaded distal end 330. The shaft is normal to the protractor 110 and to the elongate arcuate hole 140, so that the rubber wheel is disposed in the arcuate hole and rolls within it as the tool angle is adjusted. A compression spring 340 is interposed between the nut and the angle adjustment sector 210 and holds the sector flat against the internal ring gear 150.

The tool holder mount 220 includes a substantially planar platform 350 for supporting a tool holder body 370. The tool holder body includes a substantially planar round interior plate 360 having a top side 380 and a bottom side 390, and a circumference defined by a crenelated wall 400 having two sets each of opposing crenels 410/420, 430/440, and merlons 450/460, 470/480. The interior plate includes a hole 490 which is continuous through an integral cylindrical extension 500 extending downwardly from and at right angles to the plane of the bottom side 390 of plate 370. The cylindrical extension is inserted through a hole 510 disposed through tool holder mount 220, and the outside diameter of the cylindrical extension is marginally smaller than the interior diameter of hole 510, such that the interfacing surfaces form a substantially hermetic seal. Hole 510 preferably includes a chamfered upper edge 510a to facilitate the insertion of tightly fitting components during assembly.

Means to secure the tool holder in hole 510 are as follows: a taper portion 520 is cut circumferentially around the side of the cylindrical extension; two grub screws 530 are threadably inserted into one or more threaded holes 540 in the side of the tool holder mount 220 and engage the cylindrical extension at the taper portion.

The cut away taper portion also forms an annular air space 550, and because air under pressure will be fed through this space, nitrile O-rings 560, 570 are disposed above and below the annular air space to prevent gas escape above and below the rings. A plurality of small diameter air holes 580 are laser drilled into the cylindrical extension, thereby bringing pressurized air into the space immediately interior to the cylindrical extension. The threaded lower end 590 of the cylindrical extension includes a threaded stop washer 600 having a hole to accommodate a scribe tool shank.

A cylindrical air bushing 610 having a cylindrical interior wall 610a, and further having an outside diameter marginally less than the interior diameter of cylindrical extension 500 is removably inserted into the cylindrical extension. The tolerance and fit are determined by the scribe tool behavior and suspension characteristics desired for the scribing system. A channel 620 is cut for placement of a nitrile O-ring to hold the scribe tool and to prevent fluid leak below the O-ring. When fully inserted into the tool holder mount, the upper edge 630 of the scribe tool bushing is slightly recessed from the top side 380 of plate 360. Further, the air bushing includes a recessed upper end 640.

A top seal ring 650 is bonded around its outside diameter to the top side 380 of plate 360. The top seal ring includes a center relief hole 660 which brings hole 510 into fluid communication with the outside atmosphere, and it further includes a circumferential recess 670, which creates an air passage 680 in fluid communication with the space 690 above the upper end 640 of scribe tool bushing 610.

The tool holder body is designed to support a scribe tool 700 having a T-bar 710 at the upper end of a shank 720, and a sharpened diamond tip 730 at the opposite, lower end. The tip includes a plurality of cutting edges 740, preferably four, employed to scribe a semiconductor wafer during the scribing process. The scribe tool is removably inserted into the center hole 660 through top seal ring 650 and the hole defined by the cylindrical interior wall 610a of the scribe tool bushing. The scribe tool is inserted beyond O-ring 630, and through threaded stop washer 600, such that a portion of the shank and the entire tip and cutting edges are exposed a predetermined distance below the stop washer.

The foregoing elements of the tool holder body and tool holder mount comprise not only a tool holder apparatus, but the physical and operative elements of an air bearing system. While the tool holder mount 220 is a substantially solid block of material, it is drilled to include a plurality of fluid passageways for the introduction of pressurized air into the air bearing system. A first air circuit includes a first air passageway comprising a first bore 750a drilled downwardly from the top of angle adjustment sector 210 to an intersecting bore 750b drilled through tool holder mount 220, and having a first air inlet fitting 760 at its distal end and a dowel pin 770 blocking its proximal end. A first air source (not shown) is connected to air inlet fitting 760. A third bore 750c intersecting second bore 750b at a substantially right angle is also plugged at its end with a dowel pin 780, and brings the first air passageway and the pressurized air source into fluid communication with the air space 550 around cylindrical extension 500, and thus with scribe tool bushing 610 via holes 580. This circuit is always on when the machine is in operation, and floats the scribe tool on a film of air to provide relatively frictionless axial movement.

A second air circuit comprising a second air passageway 800 comprising a diagonally disposed first bore 800a drilled through tool mount holder 220 and intersecting a second bore 800b drilled downwardly from the top side 350 of tool mount holder 220. A second air inlet fitting 810 permits air to be introduced into the second passageway, and an expanded hole 820 in plate 360 brings the passageway into fluid communication with the space 680 underneath top seal ring 650, and thereafter with the spaces 490 and 690 immediately surrounding the upper portions of the scribe tool shank. A second air source (not shown) is connected to air fitting 810.

Actual movement and downward pressure of the scribe tool is controlled by the second circuit. Air at very low pressure (0-10 psi) is introduced into second air fitting 810 and makes its way to the underside of top seal ring 650 via first and second bores 800a and 800b. After passing through hole 820, the air enters the air space 680 between the top seal ring 650 and the top side 380 of the tool holder body 370. The low-pressure air is then forced to flow to the upper portion of the scribe tool shank 700 via an annular groove machined into the bottom of the top seal ring. The scribe tool is exposed to a downward force resulting from the low-pressure air multiplied by the exposed surface area on the top of the scribe tool bushing. A labyrinth seal created around the gap 660 between the top seal ring 650 and the scribe tool 700, controls the amount of low-pressure air that leaks out. This is the circuit that controls the force on the diamond when scribing wafers.

As the assembly is moved across a wafer, a resultant drag force is seen normal to the axis of the scribe tool. This force creates an overturning moment on the floating scribe tool and scribe tool bushing, which attempts to cock the bushing in its bore and jam the assembly. The number of holes in the tool holder body, and their distance apart are designed to prevent any jamming moment during normal operation. Forces as high as 50 grams can be tolerated at the tip of the diamond.

Normal scribing is done with the scribe tool 700 tilted back from zero in the 15-30 degree range. The tool holder mount moves slowly and systematically along the internal ring gear when the stepper motor rotates, thus changing the angle of the scribe tool with respect to the wafer plane. It has been found that very fine, yet continuous changes in the angle expose a fresh edge 740 on the diamond tip 720, allowing for longer life before having to scribe tools. The stepper motor preferably includes reduction gears having a reduction ratio of at least 150:1, and preferably at least 161:1. This ratio may be further increased by the final drive between the gear motor pinion 260 and the internal ring gear 160. For instance, if there are 110 teeth on the ring gear and 24 teeth on the pinion gear, a final drive ratio of 110/24=4.583:1 is achieved. Multiplied by a stepper motor ratio of 161:1, this provides an overall mechanical reduction of 737.9:1. The small stepper motor is driven electronically to accurately delivers between 10-40 steps per revolution, and preferably 20 steps per revolution.

Accordingly, viewed in terms of degrees, the foregoing mechanical elements provide a full output revolution every 737.9 stepper motor revolutions, and divided into 360 degrees per revolution, the angular displacement is 0.4879 degrees per motor revolution. The stepper motor allows for further fine tuning, providing that each full motor revolution can be divided into ½0, so the final resolution is 0.0244 degrees per step.

Typically the system may be programmed so that during scribing the system will tilt back some specified amount (depending on the material being scribed) each time the tool indexes over to scribe a new channel, i.e., after every linear pass is completed and before commencing the next pass. In operation, as the internal ring gear 150 is translated by the pinion gear 260 the arc described by the tilting apparatus locates the center of tool tilting rotation at the scribe tool tip. This can be seen clearly in FIGS. 4A and 4B. Having the center of rotation located at the cutting tip obviates the need to provide a mechanism to lower the scribe tool tip commensurate with the degree to which it is elevated by a tilting mechanism that has a center of rotation above the cutting tip, as is typical of the tool tilting mechanisms in the prior art. The home position, or most upright angle of the scribe tool range of movement (see FIG. 4A), is defined by movement of the angle adjustment sector against the snap-action limit switch 200.

As noted above, the tool tilting apparatus of the present invention provides optimal performance and durability when used in combination with a scribe tool stylus having an improved tip. FIG. 8A shows an improved scribe tool stylus tip 900 suitable for use with the inventive tool tilting apparatus and scribe tool.

FIG. 8B is a perspective view showing a conventional scribe tool stylus tip 1000. This view shows that a conventional diamond tip for a stylus, having four cutting edges 1010, each extending from a scribe point 1020 to the tip 1030. As will be readily appreciated, this tip configuration necessitates use in a "toe" scribing system, wherein the scribe tool is essentially dragged across the wafer surface; that is, the scribe tool is tilted in the direction of travel and the scribe point leads the cutting edge in engaging the wafer surface. While it is possible to push the prior art tip rather than drag it across the wafer surface, it generally requires a tilting angle of approximately 45 degrees for effective cutting. This angle is too steep to employ effectively with the air bushing system of the present invention.

Accordingly, a specially prepared diamond tip 900 adapted for use specifically with the tool tilting apparatus of the present invention is employed in a "heel" scribing procedure (push scribing as opposed to drag scribing). This is shown schematically shown in FIG. 9. In this procedure, the triangular-shaped face 910 of the tip precedes the cutting edge and the scribe tool is tipped away from the direction of travel 920. That is to say, the scribe tool is effectively pushed along the wafer surface 930. This is made possible by the structural features of the inventive tip, which include a truncated tip 940, forming four cutlets (or four small flat facets) 950, each defining a scribe tip (or scribe point) 960 disposed interiorly relative to the cutting edge 970. This configuration calls for a heel scribing procedure, as described above, and as shown in FIG. 9. It also allows the scribe tool to be tilted upwardly, more toward the vertical than prior art cutting tips. In fact, a suitable starting angle for scribing has been found to be approximately 66 degrees from the horizontal. This relatively upright positioning of the stylus makes it possible to take advantage of the air bushing system of the present invention, wherein pressure on the wafer surface is finely controlled by the pneumatic system and the tool holding apparatus.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. An automatic scribe tool tilting apparatus for holding a scribe tool during a scribing process, the scribe tool having an elongate shank and a cutting tip with a plurality of cutting edges disposed at the lower end of the shank for scribing lines in a substrate, said apparatus comprising:
    a frame comprising an angle adjustment sector and a tool holder mount attached to said angle adjustment sector and a substantially planar platform with a through hole for supporting said scribe tool holding means;
    scribe tool holding means mounted on said frame for holding the scribe tool;
    a mounting bracket for rigid attachment to a linear translation system; and
    motorized tilting means attached to said mounting bracket and operatively connected to said frame for automatically changing the angle of scribe tool shank relative to the surface being scribed throughout the scribing process, such that a fresh cutting edge is continuously exposed and used for cutting.

2. The apparatus of claim 1, wherein said angle adjustment sector has a substantially planar lower surface and said tool holder has a substantially planar upper surface for matable attachment to said substantially planar lower surface.

3. The apparatus of claim 1, wherein said scribe tool holding means comprises an air bearing system for holding the scribe tool with a cushion of air and for controlling the downward force exerted by the scribe tool cutting tip on the surface being scribed.

4. The apparatus of claim 3, wherein said frame includes at least one air circuit in fluid communication with at least one source of pressurized air to feed pressurized air to said air bearing system.

5. The apparatus of claim 4, wherein said scribe tool holding means comprises:
    (a) a tool holder body mounted on said substantially planar platform of said tool holder mount, said tool holder body including:
        (i) a substantially planar interior plate with a top side, a bottom side, and a central hole;
        (ii) a wall disposed around said interior plate and having means for securing the T-bar of the scribe tool;
    (b) a cylindrical extension extending downwardly from said bottom side of said interior plate, said cylindrical extension having a circumferential cut away taper portion and a plurality of air holes extending through the side of said cylindrical extension, said cylindrical extension inserted through the through hole disposed through said planar platform of said tool holder mount and having a threaded lower end, wherein said cut away taper portion of said cylindrical extension forms an annular air space in fluid communication with said at least one first air circuit;
    (c) a threaded stop washer threadably inserted in said threaded lower end of said cylindrical extension, and having a hole to accommodate the scribe tool shank;
    (d) O-rings disposed above and below the annular air space to prevent gas escape above and below the rings;
    (e) a cylindrical air bushing removably inserted into said cylindrical extension such that the upper edge of said air bushing is slightly recessed from said top side of said interior plate and includes a recessed upper end, said air bushing having a cylindrical interior wall and an outside diameter marginally less than the interior diameter of said cylindrical extension, said air bushing in fluid communication with said annular air space through the plurality of holes in said cylindrical extension such that pressurized air may be introduced through said annular air space and into the space immediately interior to the cylindrical extension; and
    (f) a top seal ring bonded around its outside diameter to said top side of said interior plate, said top seal ring including a center relief hole which brings the hole into fluid communication with the outside atmosphere, and further including a circumferential recess, which creates an air passage in fluid communication with the space above said air bushing.

6. The apparatus of claim 1, wherein said motorized tilting means comprises:
    a protractor;
    an internal ring gear affixed to said protractor in a side-by-side relationship;
    a stepper motor having a motor shaft and a pinion gear disposed on said stepper motor shaft, said pinion gear engaging said internal ring gear to rotatably translate said frame relative to said protractor; and
    electrical connection means for providing electrical power to said stepper motor.

7. The apparatus of claim 6, further including:
    a switch block plate mounted on either or both of said protractor and said internal ring gear;
    a switch block nut plate demountably and adjustably attached to said switch block plate; and
    a miniature snap action limit switch coupled to said switch block nut plate.

8. The apparatus of claim 6, wherein said internal ring gear includes gear teeth and said pinion gear has gear teeth in intermeshing relationship with said gear teeth of said internal ring gear.

9. The apparatus of claim 6, wherein said frame includes a cylindrical hollow and wherein said electrical stepper motor is a substantially cylindrical stepper motor inserted into the cylindrical hollow.

10. The apparatus of claim 6, wherein said stepper motor has a gear reduction ratio of at least 150:1.

11. The apparatus of claim 10, wherein said stepper motor delivers between 10 and 40 steps per revolution.

12. A motorized scribe tool tilting apparatus for a scribe tool, comprising:
   a scribe tool having an elongate shank and a cutting tip;
   a frame member including an angle adjustment sector and a tool mount holder;
   an air bearing system mounted on said frame member for holding said scribe tool about said shank and controlling the downward force exerted by the scribe tool on the surface being scribed, wherein said air bearing allows axial movement of said scribe tool;
   a mounting bracket for attachment to a linear translation system; and
   motorized tilting means attached to said mounting bracket and operatively connected to said frame member for tilting said scribe tool.

13. The apparatus of claim 12, wherein said cutting tip includes a truncated tip forming four cutlets, each defining a scribe tip disposed interiorly to a cutting edge, such that said apparatus may be employed in a heel scribing process.

14. The apparatus of claim 12, wherein said frame member includes first and second air circuits in fluid communication with at least one source of compressed air and with said air bearing system.

15. The apparatus of claim 12, wherein said tool mount holder includes a platform having a through hole for supporting said air bearing system and wherein said at least one source of compressed air comprises first and second air circuits extending to the through hole in said platform.

16. The apparatus of claim 12, wherein said air bearing system comprises:
   a tool holder body mounted on said platform of said tool holder mount, said tool holder body including an interior plate with a top side, a bottom side, and a central hole, and a wall disposed around said interior plate;
   a cylindrical extension inserted through the central hole in said interior plate and extending downwardly from said bottom side of said interior plate, said cylindrical extension having an interior diameter adapted for insertion of an air bushing and a plurality of air holes in the side of said cylindrical extension so as to place said cylindrical extension in fluid communication with said first air circuit and said outside atmosphere; and
   a cylindrical air bushing removably inserted into said cylindrical extension, said air bushing having a cylindrical interior wall and an outside diameter marginally less than the interior diameter of said cylindrical extension placing said air bushing in fluid communication with said first air circuit.

17. The apparatus of claim 12, wherein said motorized tilting means comprises:
   an arcuate gear affixed to said frame member;
   a stepper motor having a motor shaft and a pinion gear disposed on said stepper motor shaft, said pinion gear engaging said arcuate gear to rotatably translate said gear relative to said frame; and
   electrical connection means for providing electrical power to said stepper motor.

18. A method of heel scribing semiconductor wafers, comprising the steps of:
   providing a motorized scribe tool tilting apparatus including a frame member, an air bearing mounted on the frame member for holding a scribe tool about its shank, a mounting bracket for attachment to a linear translation system, and motorized tilting means attached to the mounting bracket and operatively connected to the frame member for tilting the scribe tool relative to the surface being scribed;
   mounting the scribe tool tilting apparatus on the linear translation system;
   providing a scribe tool having a shank and a truncated cutting tip with a plurality of scribing points disposed interiorly to a respective cutting edge;
   inserting the scribe tool in the air bearing;
   indexing the scribe tool at a home position in relation to a semiconductor wafer on a stage such that the shank of the scribe tool is tilted in the direction of travel during scribing;
   employing the linear translation system to move either the stage or the scribe tool such that the scribe tool is pushed linearly across the wafer surface; and
   employing the motorized tilting means to regularly change the angle of the scribe tool shank relative to the semiconductor wafer surface so as to continuously expose a fresh cutting edge.

* * * * *